(12) United States Patent
Vanden Brande et al.

(10) Patent No.: US 6,171,659 B1
(45) Date of Patent: *Jan. 9, 2001

(54) PROCESS FOR THE FORMATION OF A COATING ON A SUBSTRATE AND DEVICE FOR THE USE THIS PROCESS

(75) Inventors: Pierre Vanden Brande, Brussels; Alain Weymeersch, Wavre, both of (BE)

(73) Assignee: Recherche et développement du groupe Cockerill Sambre, en abrégé, Liege (BE)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/893,578

(22) Filed: Jul. 11, 1997

(30) Foreign Application Priority Data

Jul. 12, 1996 (BE) .................................................. 09600637

(51) Int. Cl.$^7$ .............................. C23C 14/24; C23C 14/34
(52) U.S. Cl. .......................... 427/523; 427/528; 427/530; 427/531; 427/533; 427/535; 427/571; 427/576; 427/255.4; 427/255.5; 204/192.12; 204/192.17
(58) Field of Search ..................................... 427/523, 530, 427/528, 531, 533, 535, 571, 576, 585, 587, 590, 255.4, 251, 255.5; 284/192.12, 192.17

(56) References Cited

U.S. PATENT DOCUMENTS

| | | | |
|---|---|---|---|
| 3,594,238 | 7/1971 | Hoeckelman | 148/6.3 |
| 4,478,703 | * 10/1984 | Edamura et al. . | |
| 4,629,631 | * 12/1986 | Dearnaley et al. | 427/523 |
| 4,683,149 | * 7/1987 | Suzuki et al. | 427/38 |
| 4,708,037 | * 11/1987 | Buljan et al. . | |
| 4,740,385 | 4/1988 | Feuerstein et al. | 427/38 |
| 5,241,152 | * 8/1993 | Anderson et al. . | |
| 5,346,600 | * 9/1994 | Nieh et al. | 204/192.3 |

FOREIGN PATENT DOCUMENTS

655515 * 5/1995 (EP) .
2 197 346 5/1988 (GB) .

OTHER PUBLICATIONS

Patent abstracts of Japan, JP 56–163232, Dec.–15–1981, vol. 006, No. 049.
Abstract of European application No. 0 655 515, May 31, 1995.

* cited by examiner

Primary Examiner—Timothy Meeks
(74) Attorney, Agent, or Firm—Browdy and Neimark

(57) ABSTRACT

Process for the depositing, onto a substrate, of a coating essentially constituted of an electronic conductor compound, in which the said coating is formed by producing alternatively, on the one hand, in at least one depositing zone, one or several deposits of a determined thickness of an electronic conductor element on the substrate, and, on the other hand, in at least one reaction zone, one or several reactions of the element thus deposited with ions of a reactive gas which are implanted into the deposit of the above-mentioned element over approximately this entire thickness determined in a way as to form, preferably with the totality of this element, the said compound, the above-mentioned ions being submitted to a kinetic energy below 2000 V, while the aforesaid thickness of the deposit of the element is determined as a function of the kinetic energy applied in such a way as to allow the implantation of these ions over approximately this entire thickness.

21 Claims, 2 Drawing Sheets

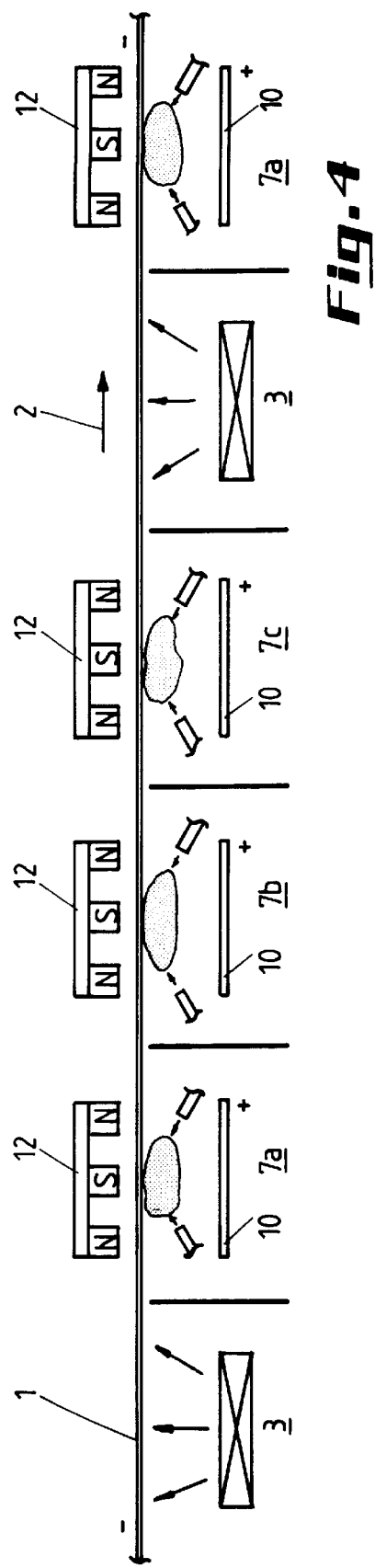

PROCESS FOR THE FORMATION OF A COATING ON A SUBSTRATE AND DEVICE FOR THE USE THIS PROCESS

FIELD OF INVENTION

The present invention relates to a process for the depositing, onto a substrate, of a coating mainly constituted of an electronic conductor compound.

BACKGROUND

According to one of the techniques known up to now, such a coating is formed by reactive cathode sputtering, also known as "reactive sputtering". Such a process especially presents the disadvantage of a comparatively low deposition speed, resulting from the contamination of the used targets from which the pulverisation is achieved.

Another known technique is the activated evaporation in a vacuum, called ARE (Activated Reactive Evaporation). This technique also has to cope with a problem of contamination of the evaporation system, which considerably reduces the efficiency of the depositing.

SUMMARY OF INVENTION

One of the essential aims of the present invention is to propose a process of the above-mentioned type, allowing to realize, at a high speed, a coating on a substrate, electrically conducting or not, and this essentially of a relatively significant thickness.

It concerns, more particularly, a process of mass production of layers of electrically conducting compounds with a thickness of the order of 1000 Å on a substrate formed, for example, of drawn steel, flat glass, a sheet of paper or a plastic film.

For this purpose, according to the invention, the said coating is formed by producing alternatively, on the one hand, in at least one depositing zone, one or several deposits of a determined thickness of an electronic conductor element, such as a metal, an alloy, a semi-conductor of the N-doped type, on the substrate, and, on the other hand, in at least one reaction zone, one or several reactions of the element thus deposited with the ions of a reactive gas which are implanted into the deposit of the aforesaid element approximately over the entire determined thickness in such a way that the said compound is formed with approximately the majority and preferably with the total quantity of this element, the aforesaid ions being submitted to a kinetic energy below 2000 V; preferably from 200 to 900 V, while the above-mentioned thickness of the deposit of the element is determined as a function of the applied kinetic energy in such a way that the implantation of these ions can be achieved over approximately this entire thickness.

Advantageously, the above-mentioned reaction of the element deposited on the substrate with the above-mentioned reactive gas is accomplished by creating, facing and in the proximity of the surface of the latter presenting the deposit of the element, a plasma in which the above-mentioned reactive gas is introduced, in such a way that ions are formed in it, penetrating into the deposit of the element, approximately over a depth corresponding to the thickness of this deposit in order to have them react with the deposited element.

According to a particular embodiment of the invention, a negative potential with regard to an anode is applied to the substrate, in the reaction zone.

According to an advantageous embodiment, the depositing of the element by evaporation, preferably in a vacuum, is followed by a condensation onto the substrate.

According to a particularly advantageous embodiment, the deposit of the element on the substrate is formed by cathode sputtering.

According to a preferred embodiment of the invention, on the substrate a coating is formed, consisting of a layer of a ceramic electronic conductor compound, for example a compound of the TiN, ZrN, TiCN, CrN, VN, NbN, InSnO type, which is obtained by the reaction of at least one metal and one reactive gas, by accomplishing first, in the depositing zone, a deposit of the said metal on the substrate, and thereafter, in the reaction zone, an ionization of the gas, in a plasma, formed facing this deposit, and an implantation of ionized particles of this gas into the metal deposit, a negative potential with regard to the ionized gas being applied to the latter.

The invention also concerns a particular device for the use of the above-mentioned process.

This device is characterized in that it includes at least one depositing zone in which a deposit of an electronic conductor element may be formed on the substrate, this depositing zone being followed by at least one reaction zone, separated from this depositing zone, where an implantation may be accomplished, into the aforesaid deposit, of particles which may react with this element in order to form the electronic conductor compound, means being provided for moving, preferably in a continuous way, the substrate from the depositing zone to the reaction zone.

Other details and characteristics of the invention will appear from the description given below, by way of unlimitative examples, of a few particular embodiments of the invention with reference to the appended figures.

BRIEF DESCRIPTION OF DRAWING

FIG. 4 is yet another schematic view of a fourth embodiment of the invention, of a device for the formation of a coating on a substrate.

In the different figures, the same reference numbers refer to analogous or identical elements.

DETAILED DESCRIPTION

Figure 1:
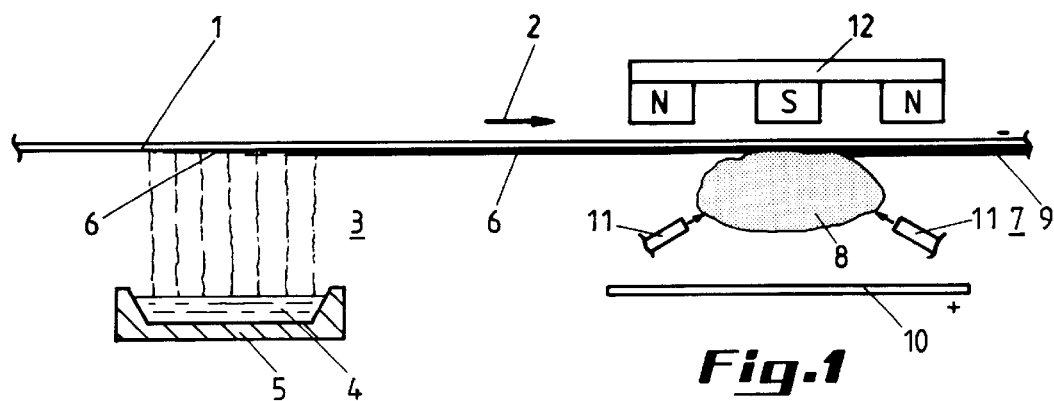
FIG. 1 is a schematic view of a vertical section of a first embodiment of the invention, an device for the formation of a coating on a substrate.

In a general way, the invention consists in proposing a process for the depositing, onto a substrate, of a coating essentially constituted of an electronic conductor compound.

The substrate may for example be made of drawn sheet steel, plates of flat glass, sheets of paper or plastic films.

The coating may be obtained by the mass production of layers, for example, of metallic or ceramic compounds, the thickness of which is generally of the order of 500 to 2000 Å. In this respect, the process according to the invention is characterized in that first a separate layer is formed on the substrate, in the depositing zone of an electronic conductor element, such as a metal, an alloy or a semi-conductor of the N-doped type, of a determined, comparatively reduced thickness. Then, in a reaction zone which is separated from the depositing zone, a reactive gas is created, containing ions which not only may react with the above-mentioned element, but which moreover possess enough kinetic energy to be able to implant themselves over the entire above-mentioned determined thickness of the deposit or layer of the element on the substrate.

This kinetic energy is advantageously maintained below 2000 V, preferably between 200 and 900 V, while the above-mentioned determined thickness is such that the implantation of the ions of the reactive gas may take place over approximately this entire thickness, and that these ions may react with the total quantity of the element forming this deposit layer. These depositing and subsequent reaction steps are repeated as many times as required for obtaining the desired final thickness of the coating.

According to an advantageous embodiment of the invention, a plasma is created, in the reaction zone, facing and close to the substrate. In this plasma, the above-mentioned reactive gas is introduced in such a way as to form ions in it, which may react, by implantation, with the element previously deposited onto the substrate.

In order to obtain the required kinetic energy for the implantation of the ions of the reactive gas into the deposit layer of the element, a negative potential is preferably applied to the substrate in the reaction zone, to negatively polarize the already formed deposit on the substrate, and, moreover, a magnetic confinement circuit is created for the electrons formed in the proximity of the surface of the substrate on which the coating is formed.

The deposit of the above-mentioned conductor element may be formed by evaporation, preferably in a vacuum, followed by a condensation onto the substrate, by cathode sputtering, by a combination of an evaporation and a cathode sputtering, or else by means of an ion gun.

The technique of combining an evaporation and a cathode sputtering forms the subject of the Belgian patent application no. 09501052 of the same applicant, while the other techniques generally constitute techniques known in themselves. In this respect, it should be noted that the ion gun is generally less interesting than the other techniques mentioned.

FIG. 1 shows a diagram of an embodiment in which the deposit of the element is formed by evaporation in a vacuum. It concerns a particular embodiment for the coating of one of the sides of a substrate 1 in the form of a continuous sheet, which is moving in an approximately continuous way in the sense of the arrow 2, first through a first zone 3 where the evaporation in a vacuum of a metal 4, kept in the molten state in a crucible 5, takes place. In this zone, a film or a layer 6 of this metal is condensed onto the side of the sheet facing the crucible 5. The substrate 1 with this film 6 is then moving to a second zone 7, separate from the first one, in which a plasma 8 is produced, in a reactive gas, for example $N_2$, $CH_4$, said plasma allowing the formation of ions in this gas. These ions are implanted into the film 6 to react with the metal of which it is made up, and thus form a coating 9 of an electronic conductor compound obtained by the reaction of the metal forming the film with the produced ions.

In order to give the ions the required kinetic energy for penetrating into the entire thickness of the film 6, a negative potential is applied to the substrate 1, in zone 7, with respect to an anode 10 arranged facing this substrate.

Reference is also made to the fact that the reactive gas is introduced into the plasma 8 through injectors 11, schematically represented in FIG. 1, and generally called "showers".

The density of the ions penetrating the film 6 is further increased by the presence of a magnetic confinement circuit on the side of the substrate covered by this film. This magnetic circuit is created by permanent magnets or possibly by electromagnets 12, mounted onto a soft steel plate, represented schematically in FIG. 1, installed near the substrate 1, on the side opposite to the one on which the film 6 is formed.

Figure 2:
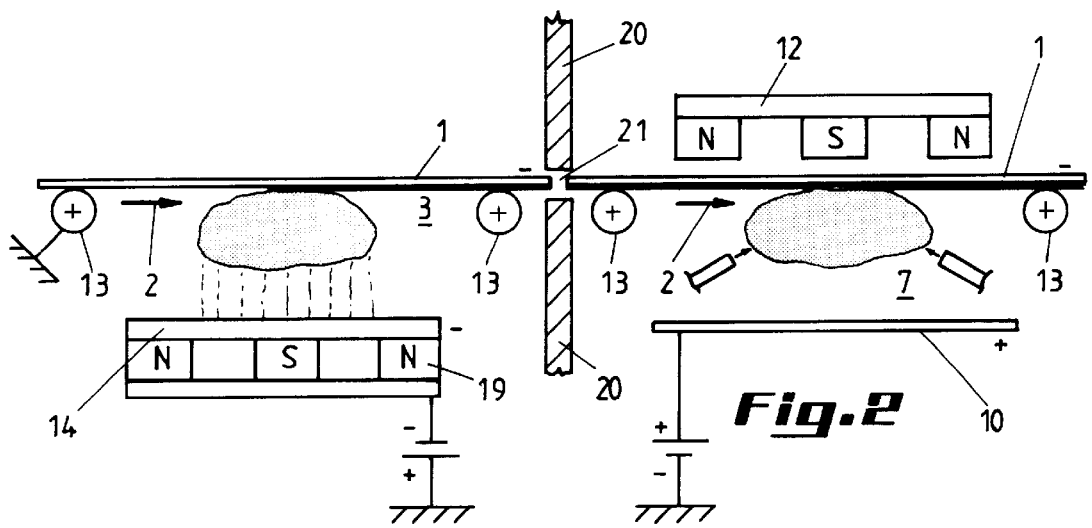
FIG. 2 is a schematic, analogous to the one of FIG. 1, of a second embodiment of the invention, of a device for the formation of a coating on a substrate.

FIG. 2 is a schematic representation of a second embodiment of the invention which relates to the formation of a coating on one of the sides of rigid plates, in particular of glass plates 1, which are moving in an approximately continuous way in the sense of the arrow 2 on earthed following rollers 13, successively through the depositing zone 3 and the reaction zone 7.

In this embodiment, the depositing of the film 6 in the depositing zone 3 is accomplished by cathode sputtering.

According to this technique, which is known in itself, in this zone 3, facing the glass plates 1, is provided a target of microwave cathode sputtering 14 provided on the side directed toward these glass plates, with a layer of the metal of which the film 6 is made up. This layer of the target 14 is bombarded by inert gas ions, such as argon ions, formed in a plasma 15, which eject metal atoms from this target 14 and form the above-mentioned film 6 on the substrate. This inert gas is introduced into the depositing zone 3 by injectors 18 inclined downward.

The target 14 is connected to a negative potential, while the rollers 13 are also earthed.

The reaction zone 7, where the ions originating from the reactive gas are implanted into this film, is almost identical to the one in FIG. 1, and is separated from the depositing zone by a wall 20, in which an opening 21 is made for the glass plates 1 to pass from the depositing zone 3 to the reaction zone 7.

Figure 3:
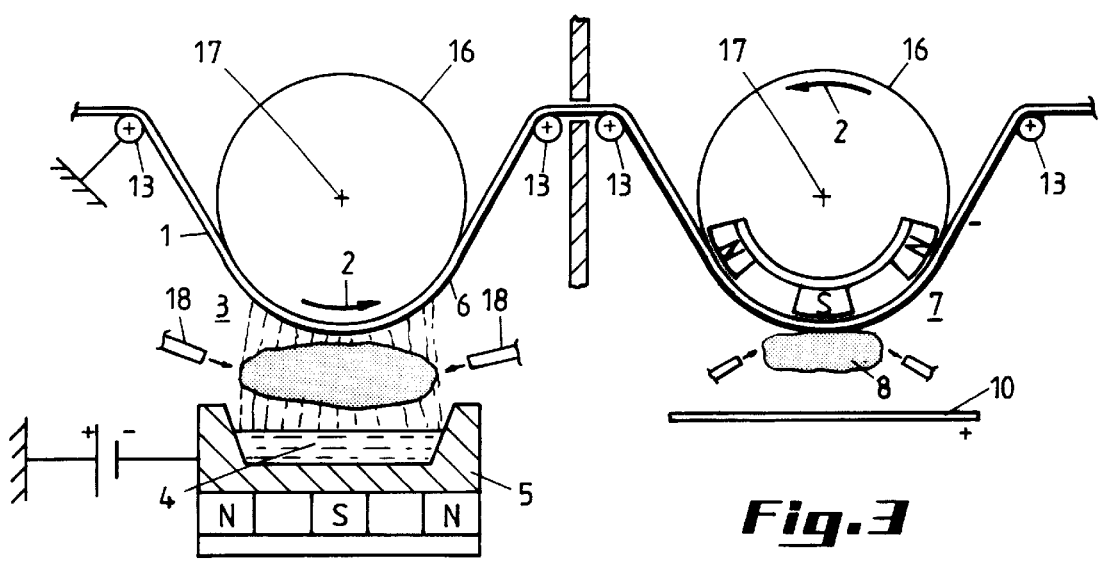
FIG. 3 is also a schematic view, analogous to those of FIGS. 1 and 2, of a third embodiment of the invention, an device for the formation of a coating on a substrate.

FIG. 3 is a schematic representation of a third embodiment, which differs from the one shown in FIG. 2 by the nature of the substrate 1, by the technique applied for the formation of the metal film 6 in the depositing zone, and by the means of transport of the substrate 1 through the depositing zones 3 and 7. In this third embodiment, the substrate is formed of a flexible sheet 1, a metal sheet, or a supple sheet of paper or a plastic matter, such as polyethylene or polypropylene, which is driven by drums 16 revolving in synchronism around their axis 17 in the sense of the arrows 2.

In the depositing zone 3 the film 6 is formed on the substrate 1 by the use of the combined technique of vacuum evaporation and cathode sputtering, as described in the Belgian patent application 09501052 of Dec. 20, 1996 of the same applicant.

Accordingly, in this case the metal 4 is maintained in the liquid state in a crucible 5 maintained at a negative potential, under which magnets 12 are installed forming a magnetic circuit, exactly as in the reaction zone 7 of the preceding embodiments.

The reaction zone 7, which follows the depositing zone 3, is separated from the latter by a wall 20, as in the second embodiment. This reaction zone 7 differs from the preceding embodiments in that the sheet 1 constituting the substrate is driven by a drum 16 and that the magnets 12, forming the magnetic circuit, are installed within the drum, facing the spot where the sheet 1 is in contact with the latter.

One of the advantages of the device according to FIG. 3 is that it allows an easy cooling of the substrate, both in the depositing and the reaction zones by means of a cooling liquid circulating within the drums. This may be useful in certain cases, for example for the treatment of substrates with comparatively low softening points or subject to phase transformations.

FIG. 4 is a schematic representation of a fourth embodiment of the invention, in which the formation of the film 6 on the substrate 1 in the depositing zones 3 may be carried out for example as in the preceding forms of embodiment.

However, what is typical in this fourth embodiment is, that a determined depositing zone is separated from the subsequent depositing zone by at least two consecutive distinct consecutive reaction zones. Thus in FIG. 4 three consecutive reaction zones 7a, 7b, 7c are shown between two depositing zones 3, where the substrate 1 is submitted to a potential which differs from one reaction zone to the subsequent one, preferably to a decreasing potential, in the sense of the movement 2 of the substrate 1 from one reaction zone to the following reaction zone. Actually, the potential difference in the zone 7a may for example be of the order of 3000 V, the one in the zone 7b of 1000 V and the one in the zone 7c of 500 V.

The invention is further illustrated by a few concrete examples of embodiment described below.

EXAMPLE 1

This example concerns the formation of a decorative coating of zirconium nitride on sheet steel using a device such as illustrated by FIG. 1, in which however a zirconium film 6 is deposited on the sheet 1, from a zirconium target 14, by cathode sputtering, as in the device shown in FIG. 2.

The sheet with a thickness of 0.2 mm was moving through the zones 3 and 7 at a speed of the order of 400 m/minute. The width of the zirconium target 14 in the reaction zones 3 in the sense of the movement 2 of the sheet 1, was 30 cm. Thus, the passing time of the sheet 1 in front of the target 14 was 0.045 sec.

In this depositing zone 3, argon was injected at a pressure of $5.10^{-3}$ Torr, while the density of the power dissipated at the target amounted to 75 W/cm$^2$.

In the reaction zone 7, also called the implantation zone, nitrogen was injected, also at a pressure of $5.10^{-3}$ Torr, while the density of the power dissipated at the substrate during the implantation of the zirconium film amounted to 20 W/cm$^2$. The tension between the sheet and the anode amounted to 450 V.

By passing the sheet successively through ten sections of this type, i.e. a depositing zone followed by a reaction zone, a sheet was obtained covered with a homogeneous final layer of zirconium nitride with a total thickness of 700 Å, which would be perfectly suitable for decoration.

EXAMPLE 2

This example concerns the formation of a layer of indium and tin oxide (InSnO), also called "ITO", on sheet glass, using the device as illustrated schematically in FIG. 2, but in which however the depositing zone 3 corresponded with the one of the embodiment shown in FIG. 1. Thus, two successive crucibles were provided, forming the targets, one crucible containing liquid tin, the other containing liquid indium. The surface of the liquid metal in each of these crucibles, exposed to the sheet glass rolling along in front of the latter, was 30 cm wide in the sense of the movement. As in the first example, the moving speed of the sheets was 400 m/minute.

In the depositing zone, argon was injected at a pressure of $5.10^{-3}$ Torr, while the density of the power dissipation at the targets amounted to 50 W/cm$^2$.

The width of the reaction zone, more particularly of the magnetic circuit defined by the magnets forming a magnetron, was 30 cm.

In this zone, oxygen was injected at a pressure of $5.10^{-3}$ Torr.

The voltage in this zone between the film composed of indium and tin, previously formed in the depositing zone on the sheet glass entering the reaction zone, amounted to 600 V and the density of the power dissipation on the substrate amounted to 30 W/cm$^2$.

As in Example 1, the sheet glass was passed through ten identical depositing zones, a same reaction zone being inserted between each of them. This allowed to obtain sheet glass covered with a homogeneous and transparent final layer of indium and tin oxide with a thickness of 1000 Å.

EXAMPLE 3

This example concerns the formation of a titanium nitride coating onto a flexible sheet of aluminium with a thickness of 0.3 mm, using an Device of the type shown in FIG. 3.

The operating conditions and parameters in the depositing and reaction zones approximately corresponded to those of Example 1. This allowed to obtain a homogeneous coating of titanium nitride with a thickness of 500 Å after ten successive passages through a depositing zone and a reaction zone.

What is claimed is:

1. A process for depositing, onto a substrate, a coating consisting essentially of an electronic conductor compound, characterized in that the said coating is formed by producing
   first, in at least one depositing zone, one or more deposits of a determined thickness of a conductive electronic conductor element on the substrate to provide a coated substrate, and
   second, in at least one reaction zone containing an anode facing said deposit of said coated substrate, wherein a potential which is negatively charged relative to the anode is applied to the coated substrate, one or more reactions of the element thus deposited, serving as cathode, with ions of a reactive gas introduced between said coated substrate and said anode, said ions being implanted into the deposit of the aforesaid element approximately over the entire determined thickness in such a way as to form with at least the majority of the total quantity of said element the electronic conductor compound, said ions being submitted to a kinetic energy below 2000 V,
   while providing a magnetic field for confinement of electrons on the side of the substrate where said reaction takes place,
   the thickness of the deposit of the element being determined as a function of the applied kinetic energy in such a way that the implantation of said ions is achieved over approximately the entire thickness.

2. Process according to claim 1, characterized in that the above-mentioned reaction of the element deposited on the substrate with ions of the above-mentioned reactive gas is accomplished by creating, facing and in the proximity of the surface of the latter presenting the deposit of the element, a plasma in which the aforesaid reactive gas is introduced, in such a way that said ions are formed in it, penetrating into the deposit of the element, approximately over a depth corresponding to the thickness of this deposit, in order to have them react with the element.

3. Process according to claim 2, characterized in that the deposit of the element on the substrate is accomplished by evaporation in a vacuum, followed by a condensation.

4. Process according to claim 3, characterized in that the deposit of the element on the substrate is further accomplished by cathode sputtering.

5. Process according to claim 4, characterized in that on the substrate a coating is formed, consisting of a layer of said electronic conductor compound in ceramic form, obtained by the reaction of a metal and said reactive gas, by accomplishing first, in the depositing zone, a deposit of the said metal onto the substrate, and thereafter, in the reaction zone, an ionization of the reactive gas, in a plasma, formed facing this deposit, and an implantation of ionized particles of this gas into the metal deposit, a negative potential with regard to the ionized gas being applied to the latter.

6. Process according to claim 2, characterized in that on the substrate a coating is formed, consisting of a layer of said electronic conductor compound in ceramic form, obtained by the reaction of a metal and said reactive gas, by accomplishing first, in the depositing zone, a deposit of the said metal onto the substrate, and thereafter, in the reaction zone, an ionization of the reactive gas, in a plasma, formed facing this deposit, and an implantation of ionized particles of this gas into the metal deposit, a negative potential with regard to the ionized gas being applied to the latter.

7. A process according to claim 6 wherein said ceramic electronic conductor compound is selected from the group consisting of TiN, ZrN, TiCN, CrN, VN and NbN.

8. Process according to claim 1, characterized in that the deposit of the element on the substrate is accomplished by evaporation followed by a condensation.

9. A process according to claim 8 wherein said evaporation is carried out in a vacuum.

10. Process according to claim 1, characterized in that the deposit of the element on the substrate is accomplished by cathode sputtering.

11. Process according to claim 1, characterized in that after each zone for the depositing of the aforesaid element, at least two successive and separate reaction zones are provided, the substrate being submitted to an electrical potential differing from one reaction zone to the subsequent reaction zone.

12. Process according to claim 1, characterized in that the substrate is constituted of a continuous strip, moving through said zones successively at a rate on the order of 400 m/minutes.

13. A process according to claim 12 wherein said continuous strip moves approximately continuously through the successive zones.

14. Process according to claim 1, characterized in that, the substrate is constituted of a plate, whereby successive plates are moved one after the other through said zones, a negative potential being applied to the deposit formed on these plates in the depositing zone.

15. Process according to claim 1, characterized in that a radio-frequency excitation is applied in the aforesaid reaction zone, near the surface of the substrate on which the coating is formed.

16. A process according to claim 15 wherein said radio-frequency excitation is in the microwave range.

17. A process according to claim 1 wherein said electronic conductor element is a metal, an alloy or a N-doped semiconductor.

18. A process according to claim 1 wherein said ions of said reactive gas are implanted into the deposit of said element approximately over the entire determined thickness in such a way as to form, with substantially the total quantity of said element, the electronic conductor compound.

19. A process according to claim 1 wherein said kinetic energy is at a value of 200 to 900 V.

20. The process of claim 1 wherein said magnetic field is provided by a magnetic circuit facing a surface of said coated substrate opposite said deposit.

21. A process for depositing, onto a continuous strip substrate, a coating consisting essentially of an electronic conductor compound, characterized in that the said coating is formed by producing first, in at least one depositing zone, one or more deposits of a determined thickness of a conductive electronic conductor element selected from the group consisting of a metal, an alloy and a semi-conductor, on the continuous strip substrate moving approximately continuously to provide a conductive coated substrate, and second, in at least one reaction zone containing an anode facing said coated substrate, wherein a potential which is negatively charged relative to the anode is applied to the coated substrate constituting a cathode, one or more reactions of the element thus deposited with ions of a reactive gas which are generated from said reactive gas in a plasma closely adjacent to said strip coated with said element, and which ions are implanted into the deposit of the aforesaid element approximately over the entire determined thickness in such a way as to form with substantially the total quantity of said element the electronic conductor compound, said ions being submitted to a kinetic energy below 900 V, while providing a magnetic field from a side of said substrate opposite said one or more deposits, for confinement of electrons on the side of the substrate where said reaction takes place, the thickness of the deposit of the element being determined as a function of the applied kinetic energy in such a way that the implantation of said ions is achieved over approximately the entire thickness.

* * * * *